(12) United States Patent
Byun et al.

(10) Patent No.: US 9,306,005 B2
(45) Date of Patent: Apr. 5, 2016

(54) ELECTRONIC DEVICE INCLUDING GRAPHENE

(71) Applicant: Samsung Electronics Co., Ltd., Suwon-Si, Gyeonggi-Do (KR)

(72) Inventors: Kyung-eun Byun, Uijeongbu-si (KR); Seong-jun Park, Seoul (KR); David Seo, Yongin-si (KR); Hyun-jae Song, Hwaseong-si (KR); Jae-ho Lee, Seoul (KR); Hyun-jong Chung, Hwaseong-si (KR); Jin-seong Heo, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 37 days.

(21) Appl. No.: 14/103,079

(22) Filed: Dec. 11, 2013

(65) Prior Publication Data

US 2014/0158989 A1    Jun. 12, 2014

(30) Foreign Application Priority Data

Dec. 11, 2012  (KR) .......................... 10-2012-0143825

(51) Int. Cl.
*H01L 29/06* (2006.01)
*H01L 29/16* (2006.01)
*H01L 29/45* (2006.01)
*H01L 29/739* (2006.01)
*H01L 29/786* (2006.01)
(Continued)

(52) U.S. Cl.
CPC ............ *H01L 29/1606* (2013.01); *H01L 29/45* (2013.01); *H01L 29/452* (2013.01); *H01L 29/456* (2013.01); *H01L 29/458* (2013.01); *H01L 29/7391* (2013.01); *H01L 29/78* (2013.01); *H01L 29/78618* (2013.01); *H01L 29/1087* (2013.01)

(58) Field of Classification Search
CPC ............................ H01L 29/7606; B82Y 10/00
USPC ................................ 257/29; 438/20; 977/734
See application file for complete search history.

(56) References Cited

U.S. PATENT DOCUMENTS 7,736,542 B2    6/2010  Shibata et al.
8,890,277 B2 *  11/2014 Hebard et al. ................ 257/471
(Continued)

FOREIGN PATENT DOCUMENTS

GB    1223704 A    3/1971
JP    8306964 A    11/1996
(Continued)

OTHER PUBLICATIONS

Office Action dated Oct. 8, 2013 received in co-pending U.S. Appl. No. 13/431,031.
(Continued)

*Primary Examiner* — Jami M Valentine
(74) *Attorney, Agent, or Firm* — Harness, Dickey & Pierce, P.L.C.

(57) ABSTRACT

According to example embodiments, an electronic device includes: a semiconductor layer; a graphene directly contacting a desired (and/or alternatively predetermined) area of the semiconductor layer; and a metal layer on the graphene. The desired (and/or alternatively predetermined) area of the semiconductor layer include one of: a constant doping density, a doping density that is equal to or less than $10^{19}$ cm$^{-3}$, and a depletion width of less than or equal to 3 nm.

24 Claims, 7 Drawing Sheets

(51) Int. Cl.
*H01L 29/78* (2006.01)
*H01L 29/10* (2006.01)

(56) References Cited

U.S. PATENT DOCUMENTS

| | | | |
|---|---|---|---|
| 8,900,538 B2* | 12/2014 | Abou-Kandil et al. | 423/276 |
| 2009/0286362 A1 | 11/2009 | Jiang et al. | |
| 2010/0132773 A1 | 6/2010 | Lagally et al. | |
| 2010/0258787 A1 | 10/2010 | Chae et al. | |
| 2011/0075467 A1* | 3/2011 | Hong | G11C 11/22 365/145 |
| 2011/0127471 A1 | 6/2011 | Shin et al. | |
| 2011/0227044 A1 | 9/2011 | Kawanaka et al. | |
| 2011/0253980 A1 | 10/2011 | Chang et al. | |
| 2012/0031477 A1 | 2/2012 | Fogel et al. | |
| 2012/0049160 A1 | 3/2012 | Sano et al. | |
| 2012/0056161 A1 | 3/2012 | Avouris et al. | |
| 2012/0141799 A1* | 6/2012 | Kub et al. | 428/408 |
| 2012/0312371 A1* | 12/2012 | Rinzler | H01L 31/022433 136/256 |
| 2013/0001516 A1* | 1/2013 | Hebard | H01L 29/1606 257/29 |
| 2013/0075700 A1* | 3/2013 | Yang | H01L 29/45 257/27 |
| 2013/0180564 A1* | 7/2013 | Hekmatshoartabari et al. | 136/244 |
| 2013/0221415 A1* | 8/2013 | Regan et al. | 257/288 |
| 2013/0313522 A1* | 11/2013 | Nourbakhsh et al. | 257/29 |

FOREIGN PATENT DOCUMENTS

| | | |
|---|---|---|
| KR | 2009-0123951 A | 12/2009 |
| KR | 2010-0086464 A | 7/2010 |
| KR | 0992483 B1 | 8/2010 |
| KR | 2011-0032999 A | 3/2011 |
| KR | 2011-0049673 A | 5/2011 |
| KR | 2011-0061909 A | 6/2011 |
| KR | 2011-0118408 A | 10/2011 |
| WO | WO-2010/025938 A1 | 3/2010 |
| WO | WO-2010/113518 A1 | 10/2010 |
| WO | WO2011015891 * 9/2011 | H01L 29/7606 |

OTHER PUBLICATIONS

Office Action issued in corresponding U.S. Appl. No. 13/431,031 on Apr. 9, 2014.

Notice of Allowance issued in corresponding U.S. Appl. No. 13/431,031 on Jul. 18, 2014.

* cited by examiner

ELECTRONIC DEVICE INCLUDING GRAPHENE

CROSS-REFERENCE TO RELATED APPLICATIONS

This application claims priority under 35 U.S.C. §119 to Korean Patent Application No. 10-2012-0143825, filed on Dec. 11, 2012, in the Korean Intellectual Property Office, the disclosure of which is incorporated herein in its entirety by reference.

BACKGROUND

1. Field

Example embodiments relate to electronic devices, and more particularly, to electronic devices using graphene to reduce an energy barrier between a semiconductor and a metal.

2. Description of Related Art

When a metal and a semiconductor, such as silicon, are joined together, a Schottky barrier may be generated due to work function differences between the two materials and a phenomenon of pinning the work function of the metal on the surface of the silicon. In this case, an increase in a contact resistance between the metal and the silicon may cause an increase in an operating voltage, resulting in consumption as thermal energy. To address this, in generally used metal oxide silicon field effect transistors (MOSFETs), a junction may be formed by increasing a doping density of silicon, and a metal may be joined thereto.

However, in this case, since a p-n junction diode form with a substrate having low doping density is achieved according to the MOSFET principle, a device design for limiting and/or preventing a junction leakage current may be considered. In addition, when a size of a device is miniaturized, doping portions of a source and a drain may meet each other, resulting in a short channel effect by which a channel is not properly formed. Accordingly, characteristics of the device may be deteriorated.

SUMMARY

Example embodiments relate to an electronic device, a field effect transistor (FET), and/or an inverter using a graphene to reduce an energy barrier between a semiconductor substrate and a metal.

Additional aspects will be set forth in part in the description which follows and, in part, will be apparent from the description, or may be learned by practice of example embodiments.

According to example embodiments, an electronic device includes: a semiconductor layer; a graphene directly contacting a desired (and/or alternatively predetermined) area of the semiconductor layer; and a metal layer on the graphene. The semiconductor layer includes an area. The semiconductor layer includes a constant doping density in overall, or the area includes at least one of: a constant doping density, a doping density that is less than or equal to than $10^{19}$ cm$^{-3}$, and a depletion width of less than or equal to 3 nm.

In example embodiments, the area of the semiconductor layer may include one of the constant doping density and the doping density that is less than or equal to $10^{19}$ cm$^{-3}$.

In example embodiments, the desired (and/or alternatively predetermined) area may have the depletion width that is less than or equal to 3 nm.

In example embodiments, the semiconductor layer may be a semiconductor substrate.

In example embodiments, the semiconductor layer may include at least one of silicon, germanium, silicon-germanium, a II-VI group semiconductor, and a III-V group semiconductor.

In example embodiments, the semiconductor layer may be weakly doped.

In example embodiments, the area of the semiconductor layer may include the depletion width of less than or equal to 3 nm.

In example embodiments, the semiconductor layer may be a semiconductor substrate.

In example embodiments, the semiconductor layer may include at least one of silicon, germanium, silicon-germanium, a II-VI group semiconductor, and a III-V group semiconductor.

In example embodiments, the semiconductor layer may be weakly doped.

According to example embodiments, a field effect transistor (FET) includes: a semiconductor layer including a channel area, a source area, and a drain area, the source and drain areas being separated from each other; first and second graphenes directly contacting the source and drain areas of the semiconductor layer, respectively, the first and second graphenes being separated from each other; source and drain electrodes on the first and second graphenes, respectively; and a gate electrode facing the channel area. The semiconductor layer may include one of: a doping density in the source and drain areas that is equal to the doping density in the channel area, and at least one of a doping density in the source and drain areas that is less than or equal to than $10^{19}$ cm$^{-3}$, and a depletion width that is less than or equal to 3 nm.

In example embodiments, the semiconductor layer may include the doping density in the source and drain areas that is one of: equal to the doping density in the channel area, and less than or equal to $10^{19}$ cm$^{-3}$.

In example embodiments, the FET may further include a gate insulation layer between the channel area and the gate electrode.

In example embodiments, a depletion width of at least one of the source and drain areas may be less than or equal to 3 nm.

In example embodiments, the semiconductor layer may be a semiconductor substrate.

In example embodiments, the semiconductor layer may include at least one of silicon, germanium, silicon-germanium, a II-VI group semiconductor, and a III-V group semiconductor.

In example embodiments, the semiconductor layer may be weakly doped.

In example embodiments, the depletion width of the source area and the drain area may be less than or equal to 3 nm.

In example embodiments, the FET may further include a gate insulation layer between the semiconductor substrate and the gate electrode.

In example embodiments, at least one part of the semiconductor substrate below the first and second graphenes may have a depletion width that is less than or equal to 3 nm.

In example embodiments, the semiconductor substrate may include at least one of silicon, germanium, silicon-germanium, a II-VI group semiconductor, and a III-V group semiconductor.

In example embodiments, the semiconductor layer may be weakly doped.

According to example embodiments, an electronic device may include: a semiconductor layer; a metal layer connected to an area of the semiconductor layer; and a graphene between the metal layer and the area of the semiconductor layer. The graphene directly contacts the area of the semiconductor layer. The graphene is configured to reduce an energy barrier between the metal layer and the area of the semiconductor layer.

In example embodiments, the graphene may be one of a single layer and two layers.

In example embodiments, the metal may have no bandgap so a Fermi level between the metal layer and the graphene may not vary, and a depletion width between the area of the semiconductor layer and the graphene may be less than or equal to 3 nm.

In example embodiments, the semiconductor layer may be a substrate, and the substrate may include at least one of silicon, germanium, silicon-germanium, a II-VI group semiconductor, and a III-V group semiconductor.

In example embodiments, the area of the semiconductor layer may include one of: a depletion width of less than or equal to 3 nm, a constant doping density, and a doping density that is less than or equal to $10^{19}$ cm$^{-3}$.

In example embodiments, a gate insulating layer may be connected to a portion of the semiconductor layer that is adjacent to the area of the semiconductor layer, and a gate electrode may be connected to the gate insulating layer. The gate insulating layer may be between the gate electrode and the portion of the semiconductor layer.

In example embodiments, the area of the semiconductor layer may be a first area of the semiconductor layer, and the semiconductor layer may include a second area spaced apart from the first area. The electronic device may include: a second metal layer connected to the second area, and a second graphene between the second metal layer and the second area. The second graphene may be configured to reduce an energy barrier between the second metal layer and the second area of the semiconductor layer.

In example embodiments, a gate insulating layer may be on a portion of the semiconductor layer between the first area and the second area, a gate electrode may be on the gate insulating layer, and the gate insulating layer may be between the first graphene and the second graphene.

In example embodiments, the first graphene and the second graphene may be spaced apart from each other on a same surface of the semiconductor layer.

In example embodiments, the doping density of the first area and the doping density of the second area of the semiconductor layer may be the same as a doping density of a portion of the semiconductor layer between the first area and the second area.

In example embodiments, the first graphene may be one of a single layer and two layers, and the second graphene may be one of a single layer and two layers.

BRIEF DESCRIPTION OF THE DRAWINGS

These and/or other aspects will become apparent and more readily appreciated from the following description of non-limiting embodiments, taken in conjunction with the accompanying drawings in which like reference characters refer to the same parts throughout the different views. The drawings are not necessarily to scale, emphasis instead being placed upon illustrating the principles of example embodiments. In the drawings.

DETAILED DESCRIPTION

Figure 1:
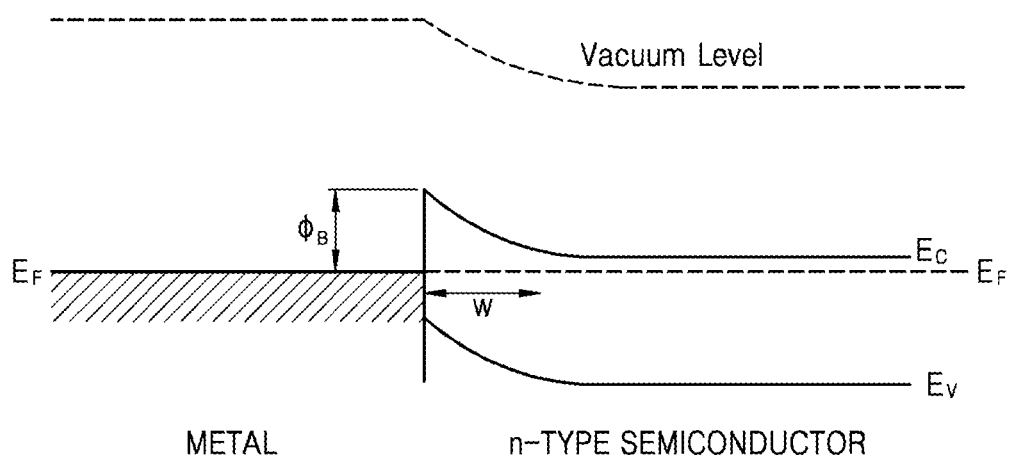
FIG. 1 is a band diagram illustrating an energy barrier between a metal and a semiconductor.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on"). In the description below, when it is described that a certain layer is provided "on", "in the upper part of", or "above" a substrate or another layer, the certain layer may be directly above the substrate or the another layer in a contact manner, or a third layer may be interposed therebetween. In this regard, example embodiments may have different forms and should not be construed as being limited to the descriptions set forth herein.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. As used herein, expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a band diagram illustrating an energy barrier between a metal and a semiconductor. Referring to FIG. 1, a Fermi level $E_F$ of the metal has a value at an interface between the metal and the semiconductor, thereby generating a Schottky barrier $\phi_B$ between the semiconductor and the metal. In FIG. 1, $E_C$ denotes a conduction band level, and $E_V$ denotes a valence band level.

For electrons to move from the metal to the semiconductor, the electrons are supposed to overcome the Schottky barrier $\phi B$. In addition, energy is demanded for electrons in a conduction band of the semiconductor to move to the metal.

To allow the electrons to overcome the Schottky barrier $\phi B$, a depletion width W may be reduced through implantation at the interface between the metal and the semiconductor, such as silicon, thereby allowing the electrons to well pass through the Schottky barrier $\phi B$. However, if a size of a device is miniaturized, doping portions of a source and a drain may meet each other, thereby resulting a short channel effect by which a channel is not properly formed, and therefore, a method of lowering the energy barrier instead of additional doping of an opposite polarity against the channel in source and drain areas is necessary.

Figure 9:
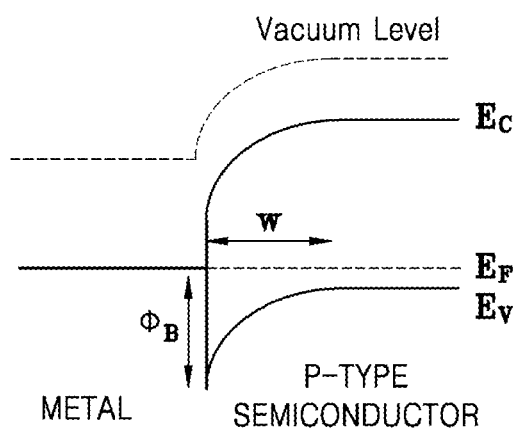
FIG. 9 is a band diagram illustrating an energy barrier between a metal and a semiconductor.

FIG. 1 illustrates a case where the semiconductor is an n-type semiconductor. In other words, FIG. 1 illustrates a case whether semiconductor may be doped with n-type impurities. FIG. 9 is a band diagram illustrating an energy barrier between a metal and a semiconductor. However, FIG. 9 differs from FIG. 1 because FIG. 9 illustrates a case where the semiconductor is a p-type semiconductor. In other words, FIG. 9 illustrates a case whether semiconductor may be doped with p-type impurities. As shown in FIG. 9, a Fermi level $E_F$ of the metal has a value at an interface between the metal and the semiconductor, thereby generating a Schottky barrier $\phi_B$ between the semiconductor and the metal. In FIG. 9, $E_C$ denotes a conduction band level, and $E_V$ denotes a valence band level.

Figure 2:
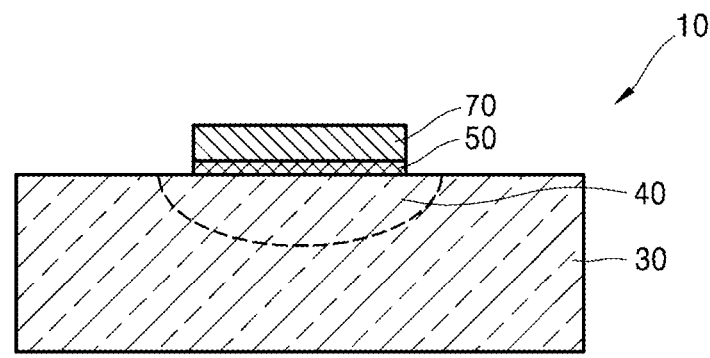
FIGS. 2 and 3 are cross-sectional views of an electronic device according to example embodiments.
Figure 3:
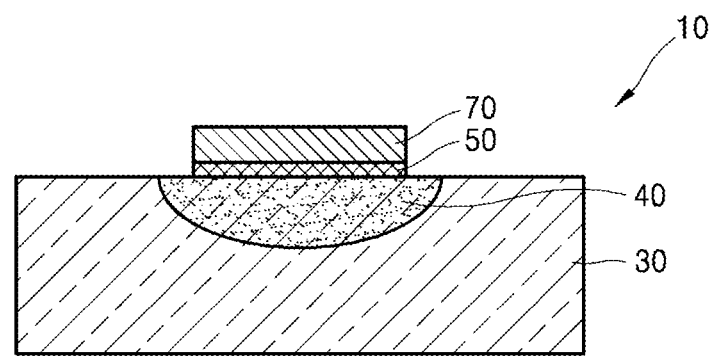

FIGS. 2 and 3 are cross-sectional views of an electronic device 10 according to example embodiments.

Referring to FIGS. 2 and 3, the electronic device 10 may include a semiconductor layer 30, a graphene 50, and a metal layer 70.

The semiconductor layer 30 may be a semiconductor substrate or a semiconductor layer formed on a semiconductor substrate (not shown). The semiconductor layer 30 may include at least one material selected from the group consisting of, for example, silicon, germanium, silicon-germanium, a II-VI group semiconductor, and a III-V group semiconductor.

The semiconductor layer 30 may have the same doping density in overall. The semiconductor layer 30 may be, for example, relatively weakly doped in an n type in overall. For example, the semiconductor layer 30 may be a silicon layer or a silicon substrate relatively weakly doped in an n type. The meaning of "relatively weakly doped" is more weakly doped than typical doped to form a source area and a drain area. However, example embodiments are not limited thereto and the semiconductor layer 30 may alternatively be relatively weakly doped in a p-type in overall. For example, the semiconductor layer 30 may alternatively be a silicon substrate that is relatively weakly doped in a p-type.

The graphene 50 may be formed on the semiconductor layer 30 to directly contact a desired (and/or alternatively predetermined) area 40 of the semiconductor layer 30. In this case, in the desired (and/or alternatively predetermined) area 40 of the semiconductor layer 30, a depletion width may be formed to be equal to or less than 3 nm.

Although FIG. 2 shows for convenience of description that the desired (and/or alternatively predetermined) area 40 is distinguished from the remaining area with a dashed line, when the semiconductor layer 30 is formed to have the same doping density in overall, (e.g., have the uniform doping density in overall without a separate doping process for the desired (and/or alternatively predetermined) area 40), the desired (and/or alternatively predetermined) area 40 does not have a boundary.

As shown in FIG. 3, the desired (and/or alternatively predetermined) area 40 may have a different doping density from that of the remaining area of the semiconductor layer 30. In this case, the area 40 may be formed to have doping density that is equal to or less than $10^{19}$ cm$^{-3}$. When the desired (and/or alternatively predetermined) area 40 has doping density that is equal to or less than $10^{19}$ cm$^{-3}$, a depletion width of the desired (and/or alternatively predetermined) area 40 may be reduced to about 3 nm or less.

The graphene 50 may be formed as a single layer or two layers. For example, the graphene 50 may include a thickness that corresponds to a single atomic layer or two atomic layers of graphene. The graphene 50 may be formed by transferring a graphene manufactured by chemical vapor deposition (CVD). The graphene 50 may be formed by transferring a graphene on the semiconductor layer 30 and patterning the transferred graphene or disposing a previously patterned graphene on the semiconductor layer 30.

The metal layer 70 may be formed on the graphene 50. The metal layer 70 may be formed of a metal usable as a metal electrode. For example, the metal layer 70 may include a metal alloy, a conductive metal oxide, a conductive metal nitride, or the like. For example, the metal layer 70 may include at least one of aluminum (Al), gold (Au), silver (Ag), beryllium (Be), bismuth (Bi), cobalt (Co), copper (Cu), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), and zirconium (Zr). The metal layer 70 may be formed by depositing such a material on the graphene 50 to form a single-layer or multi-layer structure.

In an electronic device 10 having a layered structure of semiconductor-graphene-metal according to example embodiments, an ohmic contact between a semiconductor (e.g., silicon) and a metal may be made. The ohmic contact may be made by using the property that a graphene is doped by a metal and the matter that the Schottky barrier may be removed or significantly reduced by the characteristic that a work function is not pinned on the surface of a semiconductor. In other words, an ohmic contact on a semiconductor may be made by a junction of a graphene without implantation by using a metal allowing the graphene to be doped, which may reduce a difference in the work function of the semiconductor.

According to example embodiments, for a portion at which a metal and a semiconductor meet (e.g., a transistor, in the electronic device 10), since an energy barrier is lowered using the graphene 50 instead of additional doping of an opposite polarity against a channel area in source and drain areas, an ohmic contact between the semiconductor (e.g., silicon) and the metal without an additional implantation process may be made, and the electronic device 10 may be turned on/off by gating the semiconductor.

According to example embodiments, the electronic device 10 in which an ohmic contact is made on a semiconductor by a junction of the graphene 50 without implantation may have a junctionless structure.

For silicon, to reduce a depletion width to be about 3 nm, opposite polarity doping of equal to or greater than $10^{19}$ cm$^{-3}$ may be performed in, for example, source and drain areas corresponding to the desired (and/or alternatively predetermined) area 40 in FIGS. 2 and 3. In an electronic device 10 and/or a FET according to example embodiments, as described below, since a work function of the graphene 50 may match a work function of silicon by using the property that the graphene 50 is doped to a metal and the characteristic that the graphene 50 is not pinned to silicon, a magnitude of the Schottky barrier is lowered. Thus, an ohmic contact may be made even when doping density of a portion at which a metal and a semiconductor meets is equal to or less than $10^{19}$ cm$^{-3}$.

Such a layered structure of semiconductor-graphene-metal is applicable to all semiconductor junction devices generating a Schottky barrier with various metals. Thus, the technology of the electronic device 10 according to example embodiments, which has a layered structure of semiconductor-graphene-metal may be applied instead of various metal-semiconductor junction devices.

Figure 4:
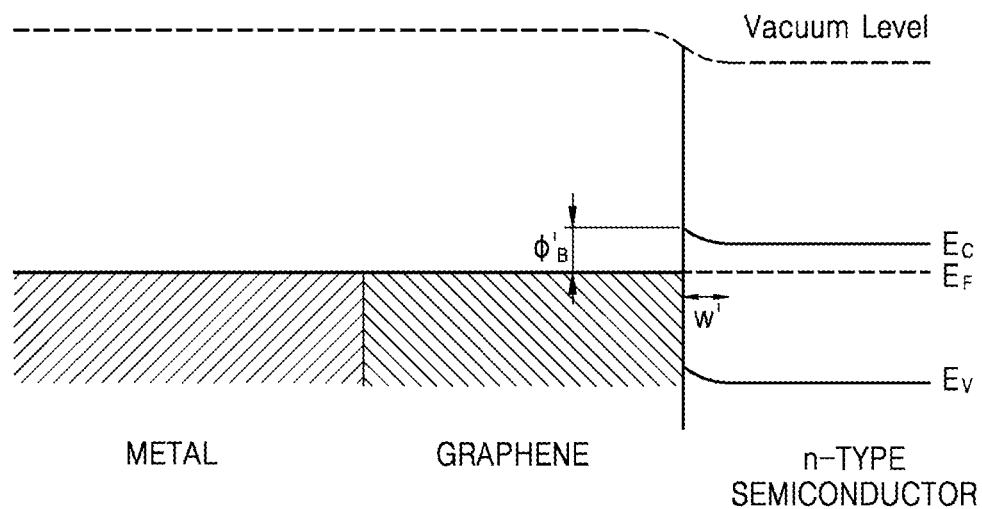
FIG. 4 is a band diagram illustrating an energy barrier of metal-graphene-semiconductor.
Figure 10:
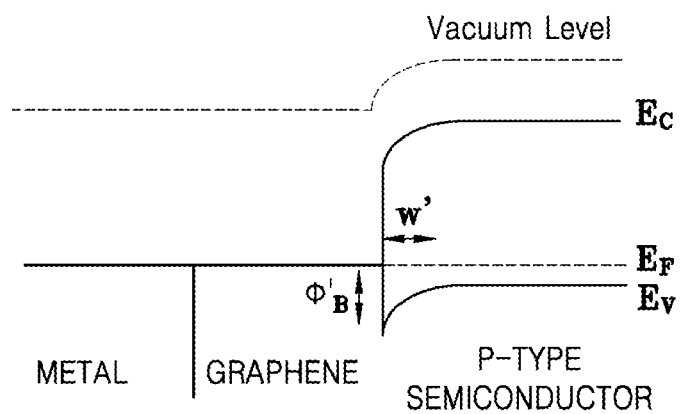
FIG. 10 is a band diagram illustrating an energy barrier of metal-graphene-semiconductor.

FIG. 4 is a band diagram illustrating an energy barrier of metal-graphene-semiconductor. FIG. 4 illustrates a case where the semiconductor is an n-type semiconductor. In other words, FIG. 4 illustrates a case where the semiconductor is doped with n-type impurities. FIG. 10 is a band diagram illustrating an energy barrier of metal-graphene-semiconductor. However, FIG. 10 differs from FIG. 4 because FIG. 10 illustrates a case where the semiconductor is a p-type semiconductor. In other words, FIG. 10 illustrates a case whether semiconductor is doped with p-type impurities.

Referring to FIG. 4, since the graphene does not have a band gap, a Fermi level $E_F$ between the metal and the graphene does not vary. However, at a junction between the graphene and the semiconductor, the graphene receives electrons from the n-type semiconductor, and thus, a work function of the graphene varies so that the Fermi level $E_F$ varies to make the energy barrier lowered. That is, the graphene is n-doped.

Thus, the work function of the graphene may decrease after a junction with the semiconductor, thereby significantly lowering a Schottky barrier $\phi'_B$ than the Schottky barrier $\phi_B$ in FIG. 1 in which no graphene exists between the semiconductor and the metal. In addition, a depletion width W' may be also reduced. This is because characteristics of the graphene having intermediate property of a metal and a semiconductor, and this phenomenon may be applied to all semiconductor-metal junction devices. In FIG. 4, $E_C$ denotes a conduction band level, and $E_V$ denotes a valence band level.

Referring to FIG. 10, since the graphene does not have a band gap, a Fermi level $E_F$ between the metal and the graphene does not vary. However, at a junction between the graphene and the semiconductor, the graphene receives holes from the p-type semiconductor, and thus, a work function of the graphene varies so that the Fermi level $E_F$ varies to make the energy barrier lowered. That is, the graphene is p-doped.

Thus, the work function of the graphene may decrease after a junction with the semiconductor, thereby significantly lowering a Schottky barrier $\phi'_B$ than the Schottky barrier $\phi_B$ in FIG. 9 in which no graphene exists between the semiconductor and the metal. In addition, a depletion width W' may be also reduced. This is because characteristics of the graphene having intermediate property of a metal and a semiconductor, and this phenomenon may be applied to all semiconductor-metal junction devices. In FIG. 10, $E_C$ denotes a conduction band level, and $E_V$ denotes a valence band level.

As described above, since the Schottky barrier may be lowered by disposing the graphene between the metal and the semiconductor, for example, additional doping having an opposite polarity to a channel at a portion at which the metal and the semiconductor meets (e.g., in source and drain areas) may not be necessary, and the source and drain areas may be sufficient with very low doping density compared with doping density required for an existing metal-semiconductor junction, e.g., with doping density that is equal to or less than $10^{19}$ cm$^{-3}$.

As an example of the electronic device 10 according to example embodiments, a FET to which a metal-graphene-semiconductor structure is applied will now be described.

Figure 5:
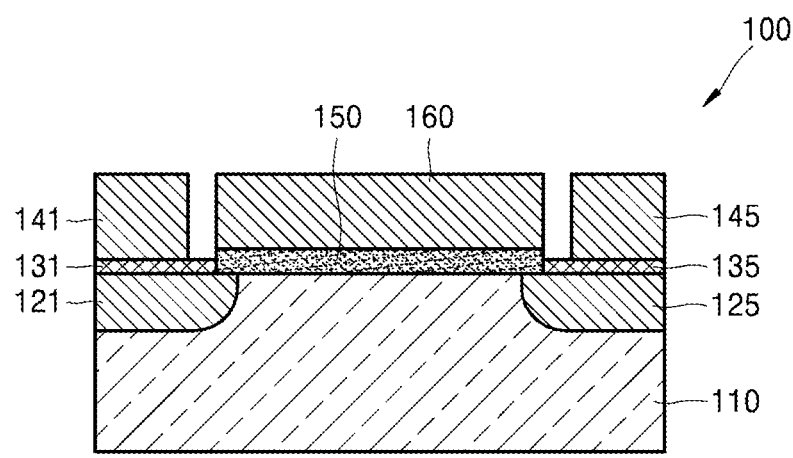
FIG. 5 is a cross-sectional view of a field effect transistor (FET) according to example embodiments.

FIG. 5 is a cross-sectional view of a FET 100 according to example embodiments.

Referring to FIG. 5, the FET 100 may include a semiconductor layer 110, first and second graphenes 131 and 135 formed on the semiconductor layer 110 to be separated from each other, a source electrode 141 and a drain electrode 145 respectively formed on the first and second graphenes 131 and 135, and a gate electrode 160 located to face a channel area. In addition, the FET 100 may further include a gate insulation layer 150 located between the channel area and the gate electrode 160. Although FIG. 5 illustrates a top-gate type in which the gate electrode 160 is formed on the semiconductor layer 110, when the semiconductor layer 110 is a layer layered on a semiconductor substrate (not shown), the FET 100 may be formed in a bottom-gate type in which the gate electrode 160 is located below the semiconductor layer 110. Hereinafter, for convenience of description, the top-gate type is described as an example with reference to FIG. 5. However, example embodiments are not limited thereto.

Referring to FIG. 5, the semiconductor layer 110 may be a semiconductor substrate or a semiconductor layer formed on a semiconductor substrate (not shown). The semiconductor layer 110 may include at least one material selected from the group consisting of, for example, silicon, germanium, silicon-germanium, a II-VI group semiconductor, and a III-V group semiconductor.

The semiconductor layer 110 may include the channel area, and a source area 121 and a drain area 125 separated from each other. A portion of the semiconductor layer 110, which is located between the source area 121 and the drain area 125 to face the gate electrode 160, may correspond to the channel area.

The semiconductor layer 110 may have, for example, the same doping density in overall. The semiconductor layer 110 may be, for example, relatively weakly doped in an n type in overall. For example, the semiconductor layer 110 may be a silicon layer or a silicon substrate relatively weakly doped in an n type or p-type.

The meaning that the semiconductor layer 110 has the same doping density in overall indicates that separate additional doping has not been performed for the source area 121 and the drain area 125, and the source area 121 and the drain area 125 have the same doping density as that of the channel area.

As another example, the semiconductor layer 110 may be formed so that the source area 121 and the drain area 125 have doping density that is equal to or less than $10^{19}$ cm$^{-3}$. In this case, the channel area may have different doping density from that of the source area 121 and the drain area 125. That is, the source area 121 and the drain area 125 may have different doping density from that of the remaining area of the semiconductor layer 110. When the source area 121 and the drain area 125 may have doping density that is equal to or less than $10^{19}$ cm$^{-3}$, a depletion width of the source area 121 and the drain area 125 may be reduced to about 3 nm or less.

As described above, the source area 121 and the drain area 125 included in the semiconductor layer 110 may be formed to have the same doping density as that of the channel area or doping density that is equal to or less than $10^{19}$ cm$^{-3}$. In FIG. 5, for convenience of drawing, the source area 121 and the drain area 125 are shown with hatching different from the remaining portion of the semiconductor layer 110.

In FIG. 5, locations of the source area 121 and the drain area 125 and locations of the source electrode 141 and the drain electrode 145 may be exchanged.

The first and second graphenes 131 and 135 may be formed on the semiconductor layer 110 to directly contact the source area 121 and the drain area 125, respectively. In this case, a depletion width may be formed to be equal to or less than 3 nm at least one of the source area 121 and the drain area 125 of the semiconductor layer 110.

The first and second graphenes 131 and 135 may be formed as a single layer or multiple layers (e.g., single or multiple atomic layers of graphene). The first and second graphenes 131 and 135 may be formed by transferring a graphene manufactured by CVD. The first and second graphenes 131 and 135 may be formed by transferring a graphene on the semiconductor layer 110 and patterning the transferred graphene or disposing a previously patterned graphene on the semiconductor layer 110.

The source electrode 141 and the drain electrode 145 are metal electrodes and may be formed on the first and second graphenes 131 and 135, respectively. The source electrode 141 and the drain electrode 145 may be formed of a metal usable as a metal electrode, a metal alloy, a conductive metal oxide, a conductive metal nitride, or the like. For example, the source electrode 141 and the drain electrode 145 may include at least one selected from the group consisting of aluminum (Al), gold (Au), silver (Ag), beryllium (Be), bismuth (Bi), cobalt (Co), copper (Cu), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), and zirconium (Zr). The source electrode 141 and the drain electrode 145 may be formed by depositing such a material on the first and second graphenes 131 and 135 in a single-layer or multi-layer structure.

The gate insulation layer 150 is formed on the semiconductor layer 110 to be located between the source electrode 141 and the drain electrode 145, and the gate electrode 160 may be formed on the gate insulation layer 150. That is, the gate insulation layer 150 may be formed between the gate electrode 160 and the channel area. The 150. The gate insulation layer 150 may be formed of an oxide, e.g., a hafnium oxide (HfO$_2$). Besides, various types of oxides may be applied to the gate insulation layer 150. In addition, the gate insulation layer 150 may be formed of various insulation materials besides the oxides. The gate electrode 160 may be formed of the same material with that of the source electrode 141 and the drain electrode 145. The gate electrode 160 may be formed of metal or metallic material of a different kind of material from that of the source electrode 141 and the drain electrode 145.

As described above, according to example embodiments, the FET 100 having a layered structure of semiconductor-graphene-metal in which the first and second graphenes 131 and 135 are formed between the source electrode 141 and the source area 121 and between the drain electrode 145 and the drain area 125, an ohmic contact between a semiconductor, e.g., silicon, and a metal may be made by using the property that a graphene is doped by a metal and the matter that the Schottky barrier may be removed or significantly reduced by the characteristic that a work function is not pinned on the surface of a semiconductor.

That is, the FET 100 may be implemented as a device junctionless between a metal and a semiconductor.

According to example embodiments, in the FET 100 as described above, a driving voltage may be reduced due to a decrease in a contact resistance, and since a size of an electrode area may be reduced due to the decrease in the contact resistance, the FET 100 may be miniaturized.

In addition, since high-density doping for the source area 121 and the drain area 125 is not necessary to lower a Schottky energy barrier, even though a size of a device is miniaturized, the occurrence of a short channel effect by which a channel is not properly formed because doping portions of the source area 121 and the drain area 125 meet each other may be reduced (and/or prevented).

Experiment results obtained by comparing a junctionless device, such as the FET 100 according to example embodiments, and a general metal oxide silicon field effect transistor (MOSFET) will now be described.

Figure 6:
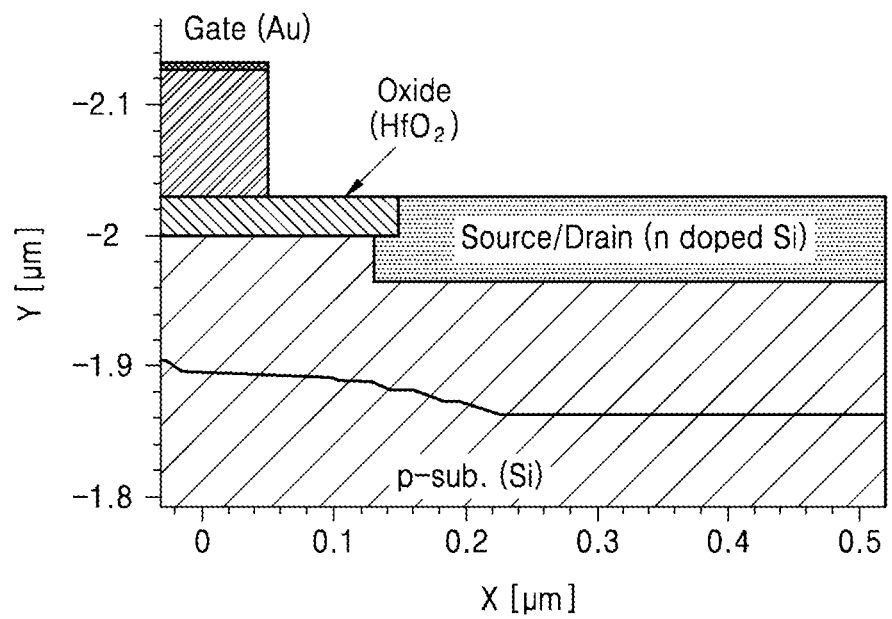
FIG. 6 is a cross-sectional view of a junctionless device used in a simulation.
Figure 7:
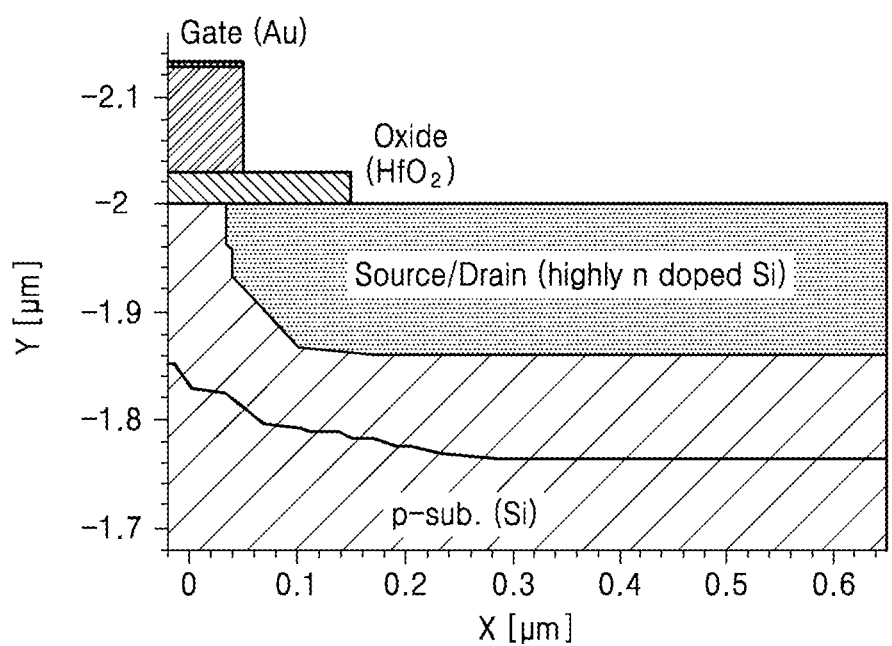
FIG. 7 is a cross-sectional view of a general metal oxide silicon field effect transistor (MOSFET) used in the simulation.

FIG. 6 is a cross-sectional view of a junctionless device used in a simulation, and FIG. 7 is a cross-sectional view of a general MOSFET used in the simulation.

As structural parameters applied to the simulation of the general MOSFET and the junctionless device, a device width of 25 μm, an electrode length of 2.0 μm, a substrate thickness of 2.0 μm, a gate insulation layer (gate oxide) thickness of 0.03 μm, and a gate electrode thickness of 0.1 μm are applied, and an electrode thickness of 0.04 μm for the junctionless device, a junction depth $X_{jSD}$ of 0.12 μm for the general MOSFET, and a junction extension $X_{jExt}$ of 0.2 $X_{jSD}$ for the general MOSFET are applied.

In the simulation, a gap between a source and a drain is about 300 nm. In this case, since doping is spread sideways due to implantation in the general MOSFET, when considering this, an actual valid channel length of the general MOSFET is about 50 nm, and an actual valid channel length of the junctionless device is about 280 nm.

Figure 8:
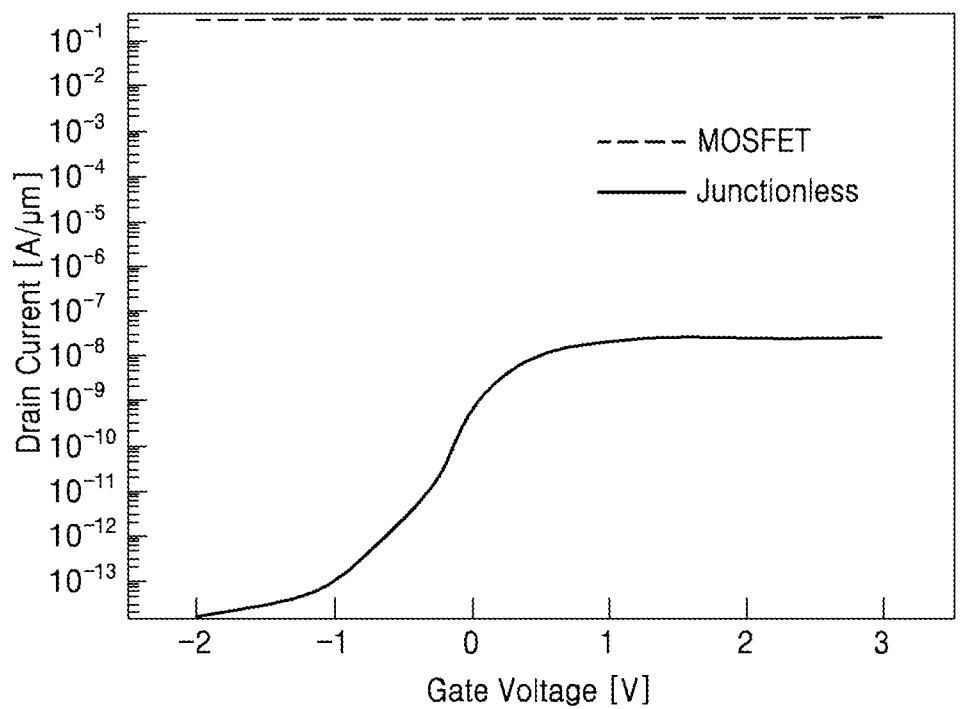
FIG. 8 is a graph showing a change in a drain current along a change in a gate voltage in each of the junctionless device and the general MOSFET, which is obtained by the simulation.

FIG. 8 is a graph showing a change in a drain current along a change in a gate voltage in each of the junctionless device and the general MOSFET, which is obtained by the simulation. A result of FIG. 8 is obtained by changing a gate voltage from −2 V to 3 V in a state where a drain voltage of 1 V is applied.

As shown in FIG. 8, the general MOSFET is always turned on with little difference between an on current and an off current due to doping in a source area and a drain area. On the contrary, an on state and an off state of the junctionless device, such as the FET 100 according to example embodiments, are surely distinguished. In FIG. 8, the junctionless device may be considered as the off state when the gate voltage is about −2 V and as the on state when the gate voltage is about 3 V.

Even though a FET having a top-gate structure according to example embodiments has been described with reference to FIG. 5, example embodiments are not limited thereto. For example, example embodiments also relate to bottom-gate FETs and dual-gate FETs.

Figure 11A:
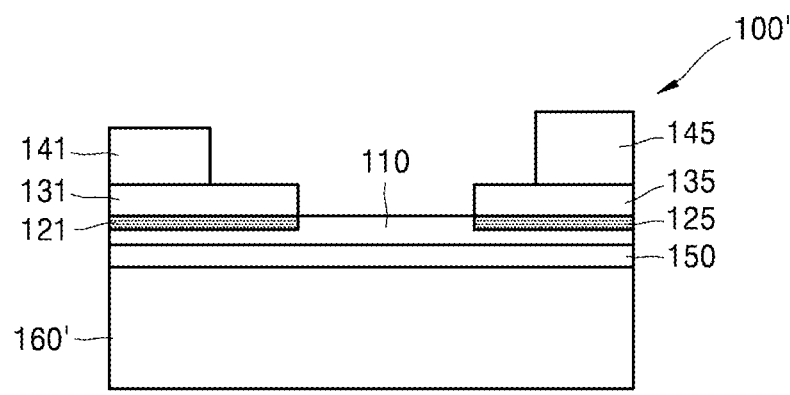
FIGS. 11A and 11B are cross-sectional views of field effect transistors (FETs) according to example embodiments.

FIG. 11A is a cross-sectional view of a FET 100' according to example embodiments.

Referring to FIG. 11A, the FET 100' may be the same as the FET 100 discussed above with reference to FIG. 5, except for the gate insulating layer 150 and the gate electrode 160. As shown in FIG. 11A, the FET 100' may be a bottom-gate FET that includes the semiconductor layer 110 on the gate insulating layer 150 and the gate insulating layer 150 on the gate electrode 160'. The gate electrode 160' in FIG. 11A may be a conductive substrate. The gate electrode 160' may be formed of the same material as the source electrode 141 and the drain electrode 145. Alternatively, the gate electrode 160' may be formed of metal or metallic material of a different kind of material from that of the source electrode 141 and the drain electrode 145.

Figure 11B:
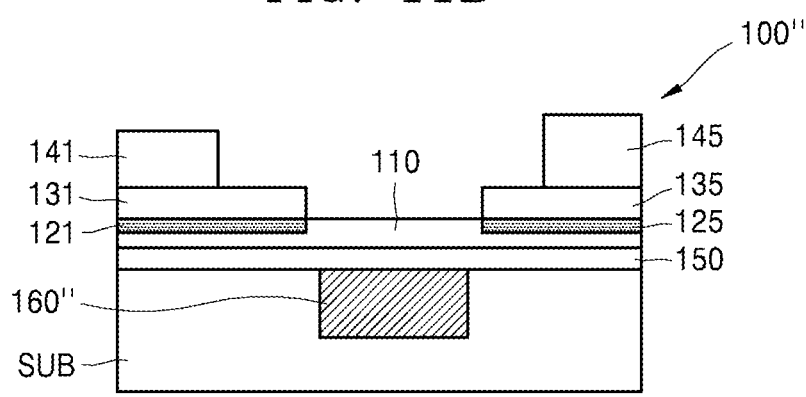

FIG. 11B is a cross-sectional view of a FET 100" according to example embodiments.

Referring to FIG. 11B, the FET 100" may be the same as the FET 100' in FIG. 11A except for the gate electrode 160'. As shown in FIG. 11B, the FET 100" may be a bottom-gate FET that includes a gate electrode 160" embedded in a substrate SUB. The gate insulating layer 150 may be formed on the gate electrode 160" and substrate SUB. The gate electrode 160" may be formed of the same material as the source electrode 141 and the drain electrode 145. Alternatively, the gate electrode 160" may be formed of metal or metallic material of a different kind of material from that of the source electrode 141 and the drain electrode 145. The substrate SUB may be formed of an insulating material. For example, the substrate SUB may be formed of silicon oxide, or a polymer such as polymethyl methacrylate (PMMA), polyolefin, polyethylene terephthalate (PET), polyethylene naphthalate (PEN), polycarbonate (PC) and/or polyethersulfone (PES). However, example embodiments are not limited thereto.

Figure 12:
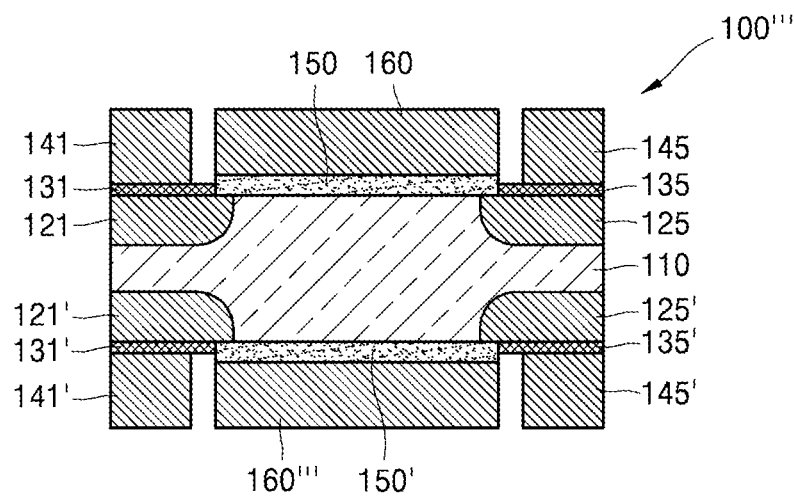
FIG. 12 is a cross-sectional view of a field effect transistor (FET) according to example embodiments.

FIG. 12 is a cross-sectional view of a FET 100''' according to example embodiments.

Referring to FIG. 12, the FET 100''' may be the same as the FET 100 discussed above with reference to FIG. 5, except the FET 100''' may be a dual-gate FET. As shown in FIG. 12, the semiconductor layer 110 may further include a source area 121' and a drain area 125' separated from each other along a bottom surface of the semiconductor layer 110. The source area 121' and the drain area 125' may be opposite the source area 121 and the drain area 125 separated from each other along an upper surface of the semiconductor layer 110. A portion of the semiconductor layer 110 along a bottom surface of the semiconductor layer 110 may correspond to another channel area.

The source area 121' and the drain area 125' included in the semiconductor layer 110 may be formed to have the same doping density as that of the portion of the semiconductor layer 110 in between the source area 121' and the drain area 125'. Alternatively, the source area 121' and the drain 125' may have a doping density that is equal to or less than $10^{19}$ cm$^{-3}$.

Third and fourth graphenes 131' and 135' may directly contact the source area 121' and the drain area 125', respectively. The third and fourth graphenes 131' and 135' may have the same structure as the first and second graphene 131 and 135 and may be formed using the same methods.

A source electrode 141' may be connected to a bottom surface of the third graphene 131' and a drain electrode 145' may be connected to a bottom surface of the fourth graphene 135'. The source electrode 141' and the drain electrode 145' may be formed of the same materials as the source electrode 141 and the drain electrode 145 discussed above with reference to FIG. 5.

In FIG. 12, locations of the source area 121 and the drain area 125 and locations of the source electrode 141 and the drain electrode 145 may be exchanged. Similarly, locations of the source area 121' and the drain area 125' and locations of the source electrode 141' and the drain electrode 145' may be exchanged.

As shown in FIG. 12, the FET 100''' may include a gate insulating layer 150' connected to a lower surface of the semiconductor layer 110 in between the third graphene 131' and the fourth graphene 135'. The gate insulation layer 150' may be formed of an oxide (e.g., a hafnium oxide (HfO$_2$)). Besides hafnium oxide, various types of oxides may be applied to the gate insulation layer 150'. In addition, the gate insulation layer 150 may be formed of various insulation materials besides the oxides. The gate insulating layer 150' may be formed of the same material as the gate insulating layer 150 or a different material than the gate insulting layer 150.

The gate electrode 160''' may be formed of the same material as that of the source electrode 141 and the drain electrode 145. Alternatively, the gate electrode 160''' may be formed of metal or metallic material of a different kind of material from that of the source electrode 141 and the drain electrode 145.

Figure 13A:
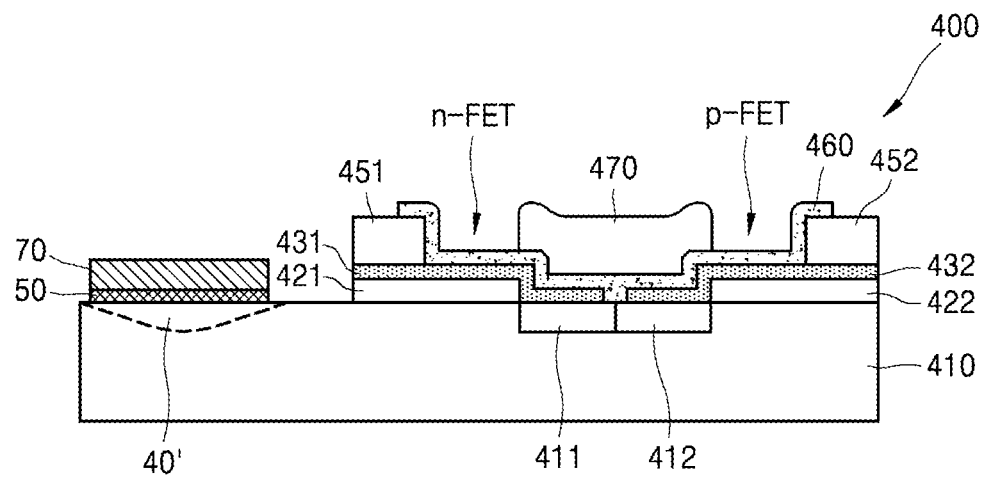
FIGS. 13A and 13B are cross-sectional views of inverters according to example embodiments.
Figure 13B:
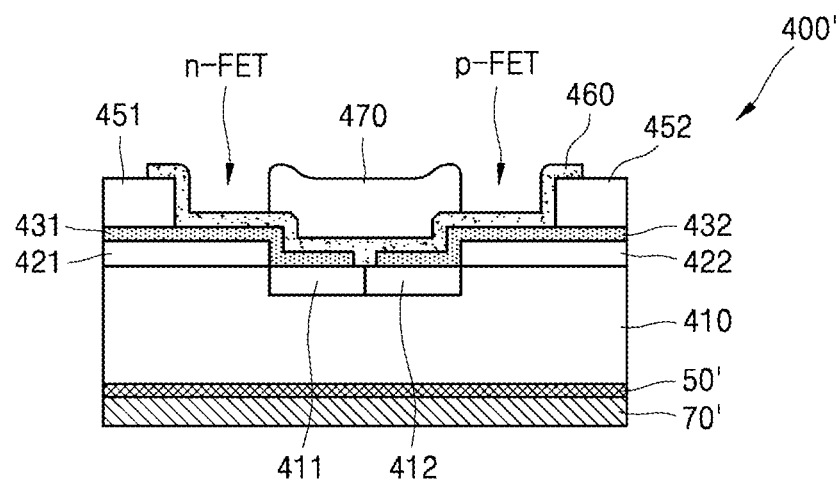

FIGS. 13A and 13B are cross-sectional views of inverters according to example embodiments.

FIG. 13A is a cross-sectional view of an inverter 400 according to example embodiments.

Referring to FIG. 13A, a semiconductor substrate 410 doped with first impurities may include a first well 411 and a second well 412 formed on (or recessed within) the semiconductor substrate 410. The first well 411 may be doped with the first impurities and the second well 412 may be doped with second impurities. The first and second impurities may be n-type impurities and p-type impurities, respectively, or vice versa. In example embodiments, the first well 411 may doped with the n-type impurities, and the second well 412 may be doped with the p-type impurities. Also, the semiconductor substrate 410 may be doped with the n-type impurities, and may be doped with the n-type impurities at the same concentration as that of the first well 411, thus there may be no boundary area between the first well 411 and the substrate 410.

A first insulation layer 421 may be formed on a first region on the substrate 410 corresponding to the first well 411. A first graphene layer 431 may be formed on the first well 411 and the first insulation layer 421. The first graphene layer 431 is formed not to contact the substrate 410 below the first insulation layer 421. A first electrode 451 may be formed on the first graphene layer 431 to face the first insulation layer 421.

A second insulation layer 422 may be formed in a second region on the substrate 410 connected to the second well 412. A second graphene layer 432 may be formed on the second well 412 and the second insulation layer 422. The second graphene layer 432 does not contact the substrate 410 underneath the second insulation layer 422. Also, the second graphene layer 432 is separated from the first graphene layer 431. A second electrode 452 may be formed on the second graphene layer 432 to face the second insulation layer 422.

The first well 411 and the second well 412 may be connected to each other. A gate insulating layer 460 covering the first and second graphene layers 431 and 432 may be formed above the first and second wells 411 and 412. A gate electrode 470 may be formed on the gate insulating layer 460 to correspond to the first and second wells 411 and 412.

The semiconductor substrate 410 may be formed of silicon, germanium, silicon-germanium, III-V group semiconductors, II-VI group semiconductors or combinations thereof. The first and second wells 411 and 412 may have a thickness sufficient for tunneling of carriers. Although the thickness varies according to a material thereof, the thickness may be about 1 nm to about 10 nm. The first and second wells 411 and 412 may be arranged to face the gate electrode 470 with the first and second graphene layers 431 and 432 interposed therebetween as illustrated in FIG. 13A. Thus, energy gaps of the first and second wells 411 and 412 may be changed by a gate voltage.

The first electrode 451 and the second electrode 452 may be formed of metal or polysilicon. The gate insulating layer 460 may be formed of silicon oxide, silicon nitride, or an oxide having a higher dielectric constant than silicon oxide (e.g., hafnium oxide).

The first and second graphene layers 431 and 432 may each include a single to four layers (and/or a single to two layers) of graphene. The graphene layers 431 and 432 may be formed by transferring and patterning graphene that is manufactured by chemical vapor deposition (CVD). The graphene layers 431 and 432 may be paths through which carriers are transferred, and may each have a zero band gap.

The insulation layers 421 and 422 may be formed of a insulating material such as silicon oxide, silicon oxynitride, or silicon nitride, but example embodiments are not limited thereto.

As shown in FIG. 13A, the graphene 50 and metal layer 70 described above with reference to FIGS. 2-3 may be formed on a desired (and/or alternatively predetermined) area 40' of the semiconductor substrate 410. The graphene 50 may be formed on the semiconductor substrate 410 to directly contact the area 40' of the semiconductor substrate 410. In this case, in the desired (and/or alternatively predetermined) area 40' of the semiconductor substrate 410, a depletion width may be formed to be equal to or less than 3 nm.

The desired (and/or alternatively predetermined) area 40' may have a different doping density from that of the remaining area of the semiconductor substrate 410. In this case, the area 40' may be formed to have doping density that is equal to or less than 1019 cm-3. When the desired (and/or alternatively predetermined) area 40' has doping density that is equal to or less than 1019 cm-3, a depletion width of the desired (and/or alternatively predetermined) area 40' may be reduced to about 3 nm or less.

The graphene 50 may be formed as a single layer or two layers. For example, the graphene 50 may include a thickness that corresponds to a single atomic layer or two atomic layers of graphene. The metal layer 70 may be formed on the graphene 50.

In an inverter 400 according to example embodiments having a layered structure of semiconductor-graphene-metal such as the metal layer 70, graphene 50, and area 40' of the semiconductor substrate 410, an ohmic contact between a semiconductor and a metal may be made. The ohmic contact may be made by using the property that a graphene is doped by a metal and the matter that the Schottky barrier may be removed or significantly reduced by the characteristic that a work function is not pinned on the surface of a semiconductor. In other words, an ohmic contact on a semiconductor may be made by a junction of a graphene without implantation by using a metal allowing the graphene to be doped, which may reduce a difference in the work function of the semiconductor.

FIG. 13B is a cross-sectional view of an inverter 400' according to example embodiments.

The inverter 400' in FIG. 13B is similar to the inventor 400 described with reference to FIG. 13A, except the inverter 400' includes a graphene 50' and metal layer 70' connected to a bottom surface of the semiconductor substrate 410 instead of the graphene 50 and metal layer 70 in FIG. 13A.

The graphene 50' may be formed as a single layer or two layers. For example, the graphene 50' may include a thickness that corresponds to a single atomic layer or two atomic layers of graphene. The metal layer 70' may be connected to a bottom surface of the graphene 50'.

As described above, in an electronic device, FET, and/or inverter according to example embodiments, an energy barrier between a semiconductor substrate and a metal may be reduced using a graphene without additional high-density doping, thereby realizing a device having no short channel effect even when a channel size is reduced.

According to example embodiments, a device structure making an ohmic contact even when doping of a part at which a metal and a semiconductor contact each other is equal to or less than 1019 cm-3 is provided, and this device structure is applicable to all semiconductor devices making a Schottky energy barrier with various metals.

It should be understood that the example embodiments described therein should be considered in a descriptive sense only and not for purposes of limitation. Descriptions of features or aspects within each electronic device, FET and/or inverter according to example embodiments should typically be considered as available for other similar features or aspects in other electronic devices, FETs and/or inverters according to example embodiments.

While some example embodiments have been particularly shown and described, it will be understood by one of ordinary skill in the art that variations in form and detail may be made therein without departing from the spirit and scope of the claims.

What is claimed is:

1. An electronic device comprising:
a semiconductor layer including an area, wherein
the area includes
a depletion width of less than or equal to 3 nm;
a graphene directly contacting the area of the semiconductor layer; and
a metal layer on the graphene.

2. The electronic device of claim 1,
wherein the semiconductor layer includes a constant doping density in overall;
or the area includes a doping density that is less than or equal to $10^{19}$ cm$^{-3}$.

3. The electronic device of claim 1, wherein the semiconductor layer is a semiconductor substrate.

4. The electronic device of claim 1, wherein the semiconductor layer includes at least one of silicon, germanium, silicon-germanium, a II-VI group semiconductor, and a group semiconductor.

5. The electronic device of claim 4, wherein the semiconductor layer is weakly doped.

6. An electronic device, comprising:
a semiconductor layer including an area,
the area of the semiconductor layer including one of a depletion width of less than or equal to 3 nm and a constant doping density in overall;
a metal layer connected to the area of the semiconductor layer; and
a graphene between the metal layer and the area of the semiconductor layer,
the graphene directly contacting the area of the semiconductor layer,
the graphene is configured to reduce an energy barrier between the metal layer and the area of the semiconductor layer.

7. A field effect transistor (FET) comprising:
the electronic device of claim 6;
first and second graphenes separated from each other;
source and drain electrodes; and
a gate electrode, wherein
the semiconductor layer of the electronic device includes a channel area, a source area, and a drain area,
the area of the semiconductor layer is one of the source area and the drain area,
the source and drain areas are separated from each other,
the first and second graphenes directly contact the source and drain areas of the semiconductor layer, respectively,
the source and drain electrodes are on the first and second graphenes, respectively, and
the gate electrode faces the channel area.

8. The FET of claim 7, wherein a doping density in the source and drain areas is one of:
equal to the doping density in the channel area, and
less than or equal to $10^{19}$ cm$^{-3}$.

9. The FET of claim 7, further comprising:
a gate insulation layer between the channel area and the gate electrode.

10. The FET of claim 7, wherein the semiconductor layer is a semiconductor substrate.

11. The FET of claim 10, wherein the semiconductor layer includes at least one of silicon, germanium, silicon-germanium, a II-VI group semiconductor, and a III-V group semiconductor.

12. The FET of claim 7, wherein the depletion width of the source area and the drain area in the semiconductor layer is less than or equal to 3 nm.

13. The FET of claim 7, wherein the semiconductor layer is a semiconductor substrate, and at least one part of the semiconductor substrate below the first and second graphenes includes a depletion width that is less than or equal to 3 nm.

14. The electronic device of claim 6, wherein the graphene is one of a single layer and two layers.

15. The electronic device of claim 6, wherein
the graphene does not have a bandgap so a Fermi level between the metal layer and the graphene does not vary, and
the depletion width between the area of the semiconductor layer and the graphene is less than or equal to 3 nm.

16. The electronic device of claim 6, wherein
the semiconductor layer is a substrate, and
the substrate includes at least one of silicon, germanium, silicon-germanium, a II-VI group semiconductor, and a III-V group semiconductor.

17. The electronic device of claim 6, further comprising:
a gate insulating layer connected to a portion of the semiconductor layer that is adjacent to the area of the semiconductor layer; and
a gate electrode connected to the gate insulating layer,
wherein the gate insulating layer is between the gate electrode and the portion of the semiconductor layer.

18. The electronic device of claim 6, wherein
the area of the semiconductor layer is a first area of the semiconductor layer;
the semiconductor layer includes a second area spaced apart from the first area;
the electronic device further includes:
a second metal layer connected to the second area, and
a second graphene between the second metal layer and the second area; and
the second graphene is configured to reduce an energy barrier between the second metal layer and the second area of the semiconductor layer.

19. The electronic device of claim 18, further comprising:
a gate insulating layer on a portion of the semiconductor layer between the first area and the second area; and
a gate electrode on the gate insulating layer, wherein
the gate insulating layer is between the first graphene and the second graphene.

20. The electronic device of claim 18, wherein the first graphene and the second graphene are spaced apart from each other on a same surface of the semiconductor layer.

21. The electronic device of claim 18, wherein the doping density of the first area and the doping density of the second area of the semiconductor layer are the same as a doping density of a portion of the semiconductor layer between the first area and the second area.

22. The electronic device of claim 18, wherein
the first graphene is one of a single layer and two layers, and
the second graphene is one a single layer and two layers.

23. The electronic device of claim 1, wherein a width of the graphene is less than a width of the semiconductor layer.

24. The electronic device of claim 6, wherein a width of the graphene is less than a width of the semiconductor layer.

\* \* \* \* \*